United States Patent [19]

Burr et al.

[11] Patent Number: 4,565,966

[45] Date of Patent: Jan. 21, 1986

[54] METHOD AND APPARATUS FOR TESTING OF ELECTRICAL INTERCONNECTION NETWORKS

[75] Inventors: Robert P. Burr, Matinicus, Me.; Raymond J. Keogh, Huntington, N.Y.; Ronald Morino, Sea Cliff, N.Y.; Jonathan C. Crowell, Brooklyn, N.Y.; James B. Burr, Centerport, N.Y.; James C. Christophersen, West Islip, N.Y.

[73] Assignee: Kollmorgen Technologies Corporation, Dallas, Tex.

[21] Appl. No.: 473,590

[22] Filed: Mar. 7, 1983

[51] Int. Cl.$^4$ .............................................. G01R 15/12
[52] U.S. Cl. ............................ 324/73 PC; 324/158 F
[58] Field of Search ............. 324/158 P, 158 F, 73 R, 324/73 PC, 73 AT, 51, 52; 364/482

[56] References Cited

U.S. PATENT DOCUMENTS

| | | | |
|---|---|---|---|
| 2,076,944 | 4/1937 | Howe | 177/351 |
| 2,301,106 | 11/1942 | Brown | 18/56 |
| 2,518,045 | 8/1950 | May | 175/183 |
| 2,603,686 | 7/1952 | Lloyd | 175/183 |
| 2,794,953 | 6/1957 | Callender | 324/71 |
| 2,930,977 | 3/1960 | Machts | 324/71 |
| 2,932,790 | 4/1960 | Davis et al. | 324/61 |
| 3,241,061 | 3/1966 | Quittner | 324/61 |
| 3,243,701 | 3/1966 | Strand | 324/61 |
| 3,255,409 | 6/1966 | Sztybel | 324/60 |
| 3,287,637 | 11/1966 | Keller | 324/62 |
| 3,308,376 | 3/1967 | Katz | 324/61 |
| 3,501,698 | 3/1970 | Becknell | 324/158 |
| 3,806,800 | 4/1974 | Bove et al. | 324/51 |
| 3,950,854 | 4/1976 | Leinfelden et al. | 33/123 |
| 3,975,680 | 8/1976 | Webb | 324/73 PC |
| 4,012,693 | 3/1977 | Sullivan | 324/73 PC |
| 4,045,737 | 8/1977 | Coberly | 324/158 P |
| 4,099,119 | 7/1978 | Goetz | 324/73 PC |
| 4,138,186 | 2/1979 | Long et al. | 339/117 P |
| 4,229,693 | 10/1980 | Irick et al. | 324/73 PC |

FOREIGN PATENT DOCUMENTS

| | | |
|---|---|---|
| 58-48860 | 4/1983 | Japan . |
| 985428 | 3/1965 | United Kingdom . |
| 1447256 | 8/1976 | United Kingdom . |
| 2143954A | 2/1985 | United Kingdom . |

OTHER PUBLICATIONS

Gerhard et al., Computerized Testing of Thin-Film Circuit Conductors, Sep. 1971, Solid State Technology, pp. 41–46.
Wedwick, Testing MLB's Continuity Testing by Capacitance, Nov. 1974, pp. 60 & 61.
Bonnet, A Procedure for the Testing of Bare PC Boards, Apr. 1979, Electronic Packaging and Production, pp. 108–110.
Boehringer et al., Electrical Probe Control, 11-1970, IBM Technical Disclosure Bulletin, vol. 13, No. 6, p. 1534.
Deskur et al., Detecting Undeleted Circuit Lines in Printed Circuit Boards, 2-1971, IBM Technical Disclosure Bulletin, pp. 2672–2673, vol. 13, No. 9.

Primary Examiner—Stanley T. Krawczewicz
Assistant Examiner—Jack B. Harvey
Attorney, Agent, or Firm—Morgan, Finnegan, Pine, Foley & Lee

[57] ABSTRACT

A method and apparatus for testing circuit boards using two or a small number of probes for making resistive and radio frequency impedance measurements e.g. capacitive measurements. The combination of resistive and impedance measurements substantially reduces the number of tests required to verify the integrity of a circuit board. The impedance or capacitive "norm" values used in testing the circuit boards can be obtained by operating the system in a learning mode. Analysis of the data provides not only fault detection but also can indicate approximate fault location.

33 Claims, 7 Drawing Figures (a) $R_{A-C} = R_a + R_c + R_e$
(b) $R_{A-B} = R_a + R_b$
(c) $R_{A-D} = R_a + R_e + R_d$
(d) $R_{B-C} = R_b + R_c + R_e$
(e) $R_{B-D} = R_b + R_d + R_e$
(f) $R_{C-D} = R_c + R_d$

METHOD AND APPARATUS FOR TESTING OF ELECTRICAL INTERCONNECTION NETWORKS

This invention relates to electrial interconnection networks, and more particularly, to methods and apparatus for testing the integrity of rigid or flexible interconnection networks.

BACKGROUND OF THE INVENTION

Interconnection networks (hereinafter also referred to as interconnection boards) are used for mounting and interconnecting electronic components in most commercial electronic equipment. The interconnection boards are generally made by either of two commonly used methods.

The most common method of manufacture is based on graphics technology wherein an image of the desired pattern is produced by mechanical or photographic printing techniques on the board surface and the actual conductors are made by a plating or an etching process, or a combination of such processes providing conductive paths.

The second type of interconnection board is made by one of the so-called discrete wiring processes. In these methods insulated wire is layed down on the board surface, usually by a point to point computer controlled program, to form the conductive pathways. The connections between terminal points and the conductive pathways may be made by mechanical deformation, soldering, or a metal plating process.

Interconnection boards may display one or more of the following defects:

a. Points of a conductor network which should be connected together have one (or more) discontinuities in the conductor path(s). This results in an "open circuit" condition with substantially infinite resistance between certain sections of the network.

b. Two independent conductor networks or conductor areas which are intended to have no electrical connection, and therefore, substantially infinite resistance between them, in fact, display an unacceptable, low value of resistance between the two networks commonly referred to as a "short circuit".

c. A conductive pathway is defective because it displays one or more sections having a resistance exceeding the acceptable level. This defect is referred to as a "resistive fault".

In an acceptable interconnection board the resistance between terminals of a common conductor network is normally in the range of from a few milliohms to a few ohms depending on the length and cross-section of the conductors. The resistance between independent networks should approach infinity, e.g., typically exceed 100 megohms.

The most common technique presently used for testing interconnection boards involves making resistance measurements between each terminal pair of each network of the board to verify the existence of a proper conductive path and, in addition, resistance measurements between a terminal of each network and a terminal of all the other networks to insure the absence of short circuits or unacceptable low resistance paths between networks. One of the disadvantages of this board testing concept is that it requires a very large number of individual measurements. For example, a board having 1000 networks and an average of 3 terminal points per network requires 499,500 tests for shorts and additional 2000 tests for opens and thus a total of 501,500 tests. Sequential measurements using moving probes are impractical with this technique because of the time needed for this large number of the test measurements and the complexity of the necessary probe movement control. Resistive measurements therefore are generally made using a special multicontact probe (known as a "bed of nails") providing contacts to each terminal point of the interconnection board being tested. With parallel contact of all of the terminals on the board at the same time, rapid electronic switching can be used to accomplish the individual measurements thereby substantially reducing the time required for testing an individual board. Such multicontact probes have to be custom made to match the terminal pattern of the interconnection board to be tested (e.g. the hole pattern in the case of boards with plated through holes) and, as such, are relatively time consuming to make and expensive. "Universal" bed of nails multicontact probes are also in use; such probes are not only very expensive, but require special adaptation tooling for each terminal pattern. Furthermore, with the trend toward interconnection board designs with increased terminal point densities, another disadvantage of the "bed of nails" concept consists in the high pressure that has to be applied to the multicontact probe fixture in order to achieve adequate individual contact pressure at each terminal point. For a contact force of only two ounces per contact, for example, a total force of 1250 pounds is required for testing an interconnection board with 10,000 terminals.

Another interconnection board testing technique which has been suggested in the past utilizes a movable probe for measuring capacitance between each terminal point and a common conductor plate. This technique is described in "Continuity Testing by Capacitance" by Robert W. Wedwick, published in Circuits Manufacturing, November 1974, pages 60 and 61 and in U.S. Pat. No. 3,975,680 issued to Larry J. Webb. This type of measurement, however, does not detect resistive faults in the conductor paths, and, therefore, does not provide complete test results suitable for assuring electrical integrity of the interconnection board being tested.

An object of the present invention is to provide a method and apparatus capable of completely testing an interconnection board which does not require a "bed of nails" or similar type multicontact probe.

Another object of the invention is to provide a method and apparatus for testing an interconnection board employing moving probes and sequential measurements and requiring only a limited number of test measurements.

Another object of the invention is to provide a method and apparatus which can operate on a "self learning" mode to develop criteria for accepting and rejecting boards.

Another object of the invention is to provide an apparatus and testing method capable of determining the signal transmission characteristics of the network interconnections.

Still another object of the invention is to provide a board testing method and apparatus which not only detects faults, but which is also capable of giving the location of faults on the board.

SUMMARY OF THE INVENTION

Applicants have found that by using two, or a small number, of moving probes, the combination of resistance measurements with radio frequency impedance measurements, e.g., capacitance measurements in accordance with the present invention, an unexpected and substantial reduction of sequential measuring operations or tests is achieved for assuring electrical integrity of the interconnection board tested; the concept of the present invention allows at the same time to test the board completely and for all types of defects described hereinbefore. Furthermore, the concept of this invention avoids the necessity of individual test fixtures.

With the invention only two probes need be in contact with terminal points on the board under test at any given time. Thus, the invention provides adequate contact pressure without exposing the interconnection board to the excessive forces necessary for testing boards with high terminal density when using the bed of nails method.

In a preferred embodiment of the present invention, each segment of a network is tested for continuity integrity by a resistance measurement test which detects open faults and resistance faults. A single impedance, e.g. a capacitance test, at any point in a selected network, taken with respect to a common reference plane establishes whether the network is shorted to any other network. As a result, the number of required test operations is greatly reduced.

For the test method of the prior art employing resistance measurement tests and a bed of nails or moving probes the number of tests is given as follows:

For N=number of networks of the interconnection board;

P/N=the average number of terminals per network.

The number of tests required to determine whether any network is shorted to any other network is: $(N^2-N)/2$; and, the number of tests required to verify continuity integrity of each network is $(P/N-1)N$.

Using the method of the present invention in its preferred embodiment, the number of tests required with respect to possibly existing shorts is only N, namely one impedance, e.g. capacitance test, per network; and, the number of tests to verify continuity within each of the networks is, as before, $(P/N-1)N$.

Using the previously mentioned example of an interconnection board having 1000 network with an average of three terminal points per network, the prior art methods (bed of nails or movable probes for resistance measurements) require $$\frac{1000^2-1000}{2}+(3-1)1000=499\,500+2\,000=501\,500$$

tests for testing the board for shorts, opens and resistive faults.

The method of the present invention in the above described, preferred embodiment requires only 1000 tests for shorts and $(3-1)1000=2,000$ tests for opens and resistive faults or a total of 3,000 tests for completely testing the interconnection board of the example. The number of tests is thus reduced by a ratio of 160 to 1.

The system according to this invention can be operated in a "learning mode" by evaluating a sample board or sample quantities of boards of the kind to be tested to derive information for establishing the parameters for subsequent testing of the same type of board. Moreover, the invention in one of its embodiments provides for the generation of information for giving locations of defects present on a board.

According to a preferred embodiment of this invention at least two, preferably independently movable probes are employed which follow a sequence contacting terminal points. The capacitance is measured between the terminals and a conductive reference plane either adjacent the interconnection board or forming part of the interconnection board. The measured capacitance is a function of the length and width of the conductor(s) connected to the terminal and serves to detect the "open circuit" and "short circuit" defects as previously defined. A resistance measurement is then made between terminals within the network to detect any "resistance faults".

The correct capacitance values for a good interconnection board without faults are, in general, difficult to calculate since, in addition to the effect of the conductor length, the capacitance value is also affected by fringe effects, variations in conductor width, and variations in distance between the conductor and the conductive reference plane. To eliminate the need for such calculations, as mentioned before, the system according to the invention may be used in a self learning mode. Capacitance measurements are first made on several boards. Measurements falling outside one mean deviation from the "norm" for a particular terminal are eliminated and the "norm" is then recalculated. In this manner a set of measured values is derived which can be used in further measurements of boards of the same type to detect "open circuits" and "short circuits".

In a preferred embodiment according to the concept of the invention the location of the defects in the board can be indicated. The resistance measurement of each segment of each network will indicate the location of each "open" or "resistance faulted" segment. In the case of an "open circuit" defect, use may be made under certain conditions of the capacitive measurements which indicate the length of conductor connected to each terminal. By comparing the measurements of a faulty interconnection board with the correct values for fault free board, the approximate length of the conductor from each terminal to the location of the "open circuit" may be determined and, thus, the location of the defect established.

In the case of a "short circuit" condition, the capacitive measurements can be examined to determine which two independent networks are in contact with each other and thus shorted together. Both networks will have abnormally high capacitive measurements if compared to the norm capacitance values for the respective intact networks and will show about the same value. In accordance with one embodiment, resistance measurements between terminals of the two shorted networks provides sufficient data to determine the conductor distance from each terminal to the point of the short, thus, establishing the locus of the defect.

BRIEF DESCRIPTION OF THE DRAWINGS

The foregoing and other objects of the invention will become apparent from the following detailed specification which sets forth illustrative embodiments of the invention. The drawings form part of this specification wherein.

DETAILED DESCRIPTION OF THE INVENTION

Figure 1:
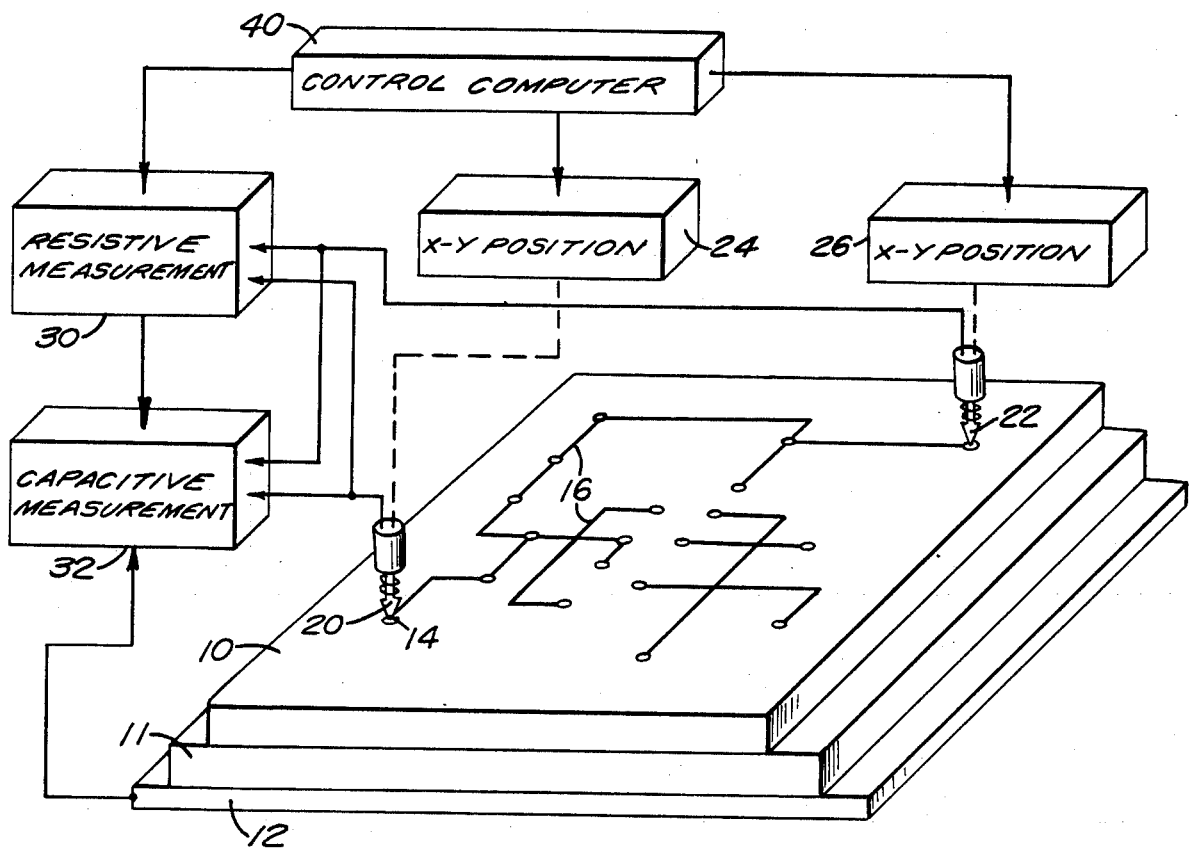
FIG. 1 is a schematic block diagram showing the apparatus according to the invention.

Apparatus according to the invention is shown diagrammatically in FIG. 1. A circuit board 10, to be tested, is placed on a dielectric layer 11 which overlies a conductive plate 12. The circuit board includes various terminal holes at locations 14 and interconnecting conductors 16. The terminal points can be in the form of holes with plated walls and lands surrounding the holes on the board surface or can be in the form of plated pads or other known forms. The terminal points are interconnected by conductors to form separate conductor networks.

The apparatus of this embodiment includes at least two independently movable probes 20 and 22, as shown in FIG. 1. Each probe includes a shaped contact portion which can be raised and lowered by conventional apparatus, e.g., pneumatic or solenoid actuators. When in the lowered position a downward force is applied to the contact area, such as supplied by a compression spring, to thereby insure good contact between probe and terminal. The locations of probes 20 and 22 with respect to the board being tested are controlled, respectively, by x-y positioning systems 24 and 26. These positioning systems are capable of moving the probes to any desired x-y coordinate so that, when lowered, a probe can contact any desired terminal point on the board.

The probes are electrically connected sequentially to a resistance measuring device 30 and a capacitive measuring device 32. When activated, the resistive measuring device measures the resistance between probes 20 and 22 and the capacitive measurement device, measures the capacitance between the activated probe(s) and plate 12.

These measured resistance values vary according to the conductor length. For most boards of normal configuration the resistance of a conductive pathway is between a few milliohms and a few ohms.

The capacitive measurements indicate the capacitance between the conductor(s) (if any) connected to the respective terminal and the conductive plate 12. The measured value is a function of the total length and width of conductors connected to the terminal. All terminals connected to the same conductor network will show very nearly the same capacitance value. In the case of an "open circuit" condition, one or more of the terminals will show a capacitance value below the "norm" for the network thus indicating a conductor connected thereto which is shorter than it should be. "Short circuit" conditions i.e., a connection between two independent networks, result in abnormally high capacitance values appearing at all terminals belonging to the shorted networks.

Suitable resistance and capacitance measurement devices may be designed by persons skilled in the art and are available commercially, e.g., from the Hewlett-Packard Company (Model 4262A LCR Meter).

Operation of the apparatus is preferably controlled by a computer 40. The computer supplies the x and y coordinate positions to positioning systems 24 and 26 to bring the probes into contact with desired terminal hole pairs. The computer also activates measuring instruments 30 and 32 when measurements are desired and records the measured values.

The computer is supplied with data giving the coordinates of all terminal holes on the board and is further supplied with information indicating which groups of the terminal holes connect to specific conductor networks.

The computer can be supplied with the specific sequence of measurements, or, preferably, can develop a sequence on the basis of the coordinates information.

The board 10 under test is aligned on the board support of the tester which includes dielectric layer 11 and plate 12 so that the rows of terminal points, are parallel to the x and y axes as much as possible. The data base controlling probe positioning is pre-sorted to position probe number 20 to the first terminal point of the first row and then to each adjacent terminal point.

Probe 20 is lowered into contact with the hole, and the capacitance of this terminal point, with respect to reference plate 12 is measured and recorded by the computer. Probe 22 is then moved into position over the point corresponding to an end of the same network. After probe 20 has measured the capacitance as described above, probe 22 is lowered into contact. Probe 20 is electrically switched from the capacitance measuring mode to the resistance (or conductance) measuring mode and the two probes are now used to determine the end to end resistance of the network or the terminal to end resistance if the terminal connected to probe 20 is not at the end. This value is also recorded by the computer.

Probe 20 is then switched back to the capacitance measuring mode and moved into position over the next terminal point of the first row and the process is repeated. This procedure is followed terminal point by terminal point and line by line with probe 20 progressing from the first row to the second, third, etc. and probe 22 positioning itself over network end points. The design of the probes is such as to permit simultaneous probing of two adjacent terminal points (holes) in the same row, thus, providing for the testing of two adjacent terminal points (e.g. plated through holes or pairs) in the same row.

Within the concept of the present invention the probes may be programmed in a variety of different ways for performing static and dynamic testing of the interconnection boards. One of the probes may be programmed to measure capacitance with respect to the reference plane. Alternatively both probes may be programmed to measure capacitance thus increasing the throughput. A common probe may measure capacitance and then be switched in function to read resistance in cooperation with another probe, or separate probes can be used for the capacitance and the resistance measurements. Other testing techniques can also be combined. For example, one probe may be programmed to inject a burst of high voltage, radio frequency energy into a network while other probes monitor the resultant current to thereby test for high stress breakdown. As another example, one probe may be pulsed with a steeply rising waveform of voltage which is injected into the end point of a network and the same probe can be connected to apparatus which can be used to measure the magnitude of the reflected wave indicating the characteristic impedance of the network.

Capacitive values for a circuit board may in principle be calculated. The capacitance is principally a function of the area of the conductor run. It is also affected by other factors such as the distance between the conductor and the conductive plate employed as reference plane, the effect of other conductors in the electrostatic field of the measurement, and various fringing effects due to conductor configuration. Actual calculation of capacitance values is, therefore, obviously difficult. Rather than require the operator to determine the capacitive values for a board without defects, it is preferable to use a self learning approach where the correct value is derived from actual measurements. The method of the invention can be carried out manually, but is preferably done automatically by a control system which can be either a dedicated digital control system or a programmed general purpose digital computer.

The following section describes the "Learn Mode" in detail for an interconnection board having terminal holes with metalized walls to form terminal points.

Figure 2A:
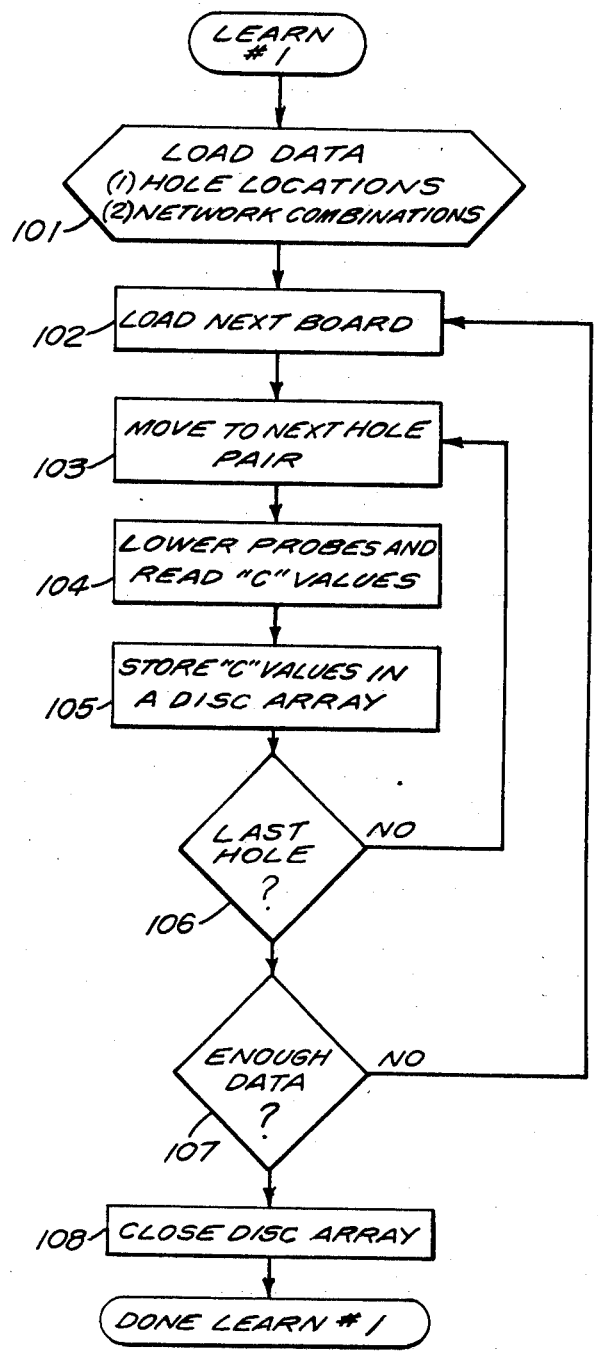
FIGS. 2A-2D are flow diagrams illustrating the method by which tests are made according to the invention.

FIG. 2a is a flow diagram for acquiring information in a learning mode called "LEARN #1" which information is subsequently used to determine the normal capacitive values for the interconnection board. In step 101 the computer is loaded with information indicating the x and y coordinates of all the terminal holes on the board as well as data indicating which terminal points are interconnected in network combinations.

An interconnection board is then loaded i.e., placed in position above conductive plate 12 forming the reference plane and dielectric 11 (FIG. 1) in step 102. Thereafter the computer supplies the x and y coordinate information to the probe positioning apparatus in step 103. In the learning mode the system is only required to make capacitive measurements and, hence, only one probe need be used. However, the data can be acquired more quickly using both probes and, hence, the use of two probes is preferable. Once the probes are positioned they are lowered into contact with the terminal holes or lands and the capacitive measurements are made to determine the "C" values in step 104. The "C" values are stored in the computer memory in step 105. In decision 106 the computer determines if it has measured capacitance of the last hole and, if not, the computer returns to step 103 to advance to the next hole pair and another set of measurements. Operation continues in this fashion until the last hole has been measured at which point the computer advances from decision 106 to decision 107.

The computer next determines if it has sufficient data for determination of the "norm" values. If the same capacitive value for a particular terminal point appears in measurements on a number of boards, it can be assumed that this is the correct capacitive value for a board free from defects. Usually data from 3 to 10 boards is sufficient to determine the "norm" values. When sufficient data has been obtained the memory disc array is closed in step 108 and the system proceeds to determine the "norm" values according to the flow diagram in FIG. 2b called "LEARN #2".

Figure 2B:
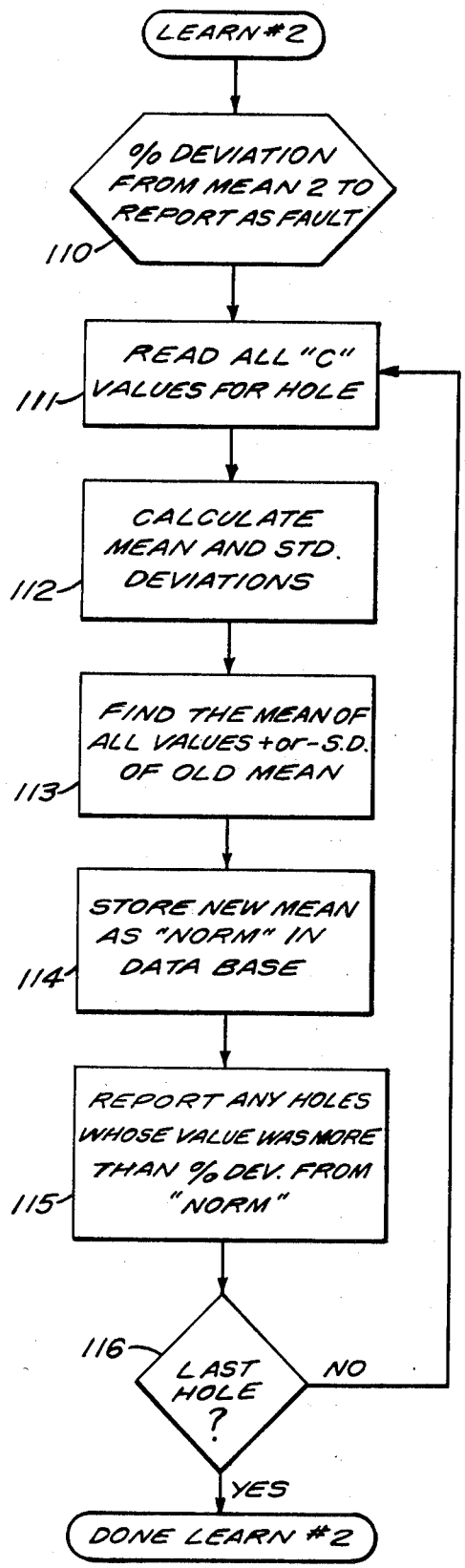

First, as indicated in step 110 of FIG. 2b, the computer is supplied with additional information indicating the "percent deviation" for the norm value which should be flagged as an error. For most boards a value of 10% deviation from the norm is sufficiently wide to pass all good boards and, at the same time, detect and reject all defective boards. For less critical applications a 20% deviation may be appropriate. In some cases the value can be as high as 30%.

In processing the data according to the learning mode, the computer in step 111 calls up from memory all the data for a particular terminal hole and then calculates the mean and standard deviation for these values in step 112. In step 113 values that fall more than one standard deviation either side of the mean value are discarded and a new mean value is calculated and stored as the "norm". In decision 116 the computer determines whether or not the data for all of the terminal holes have been evaluated and, if not, the sequence returns to step 111 for evaluation of data on the next terminal hole.

Data points which are above and below values permitted within the designated "percent deviation" are flagged by the computer as faults. As previously mentioned the "percent deviation" value is assigned and not fixed because the tolerance should be a function of the type of board being tested. As an example, discrete wiring boards, using constant diameter wire for forming conductors may be assigned tighter tolerance than a dense multilayer board with very fine conductor lines (e.g., five mills wide) and subject to much larger percentage variations due to the etching or plating process variations.

Tables 1 and 2 illustrates the type of data collected in the learning mode which may be used in establishing of the "norm" values. A simple example of how the learn mode data might appear for one four-hole network in a sample lot of five boards wherein one of the boards does contain an open circuit is shown in Table 1. Table 2 shows the data for a simple three-hole network containing a board with a suspected short circuit.

TABLE 1

| | | | Data of Network #3 | | | |
|---|---|---|---|---|---|---|
| NET # | HOLE # | BOARD #1 | BOARD #2 | BOARD #3 | BOARD #4 | BOARD #5 |
| 3 | 1 | 40.1* | 39.5 | 39.9 | 40.2 | 40.0 |
| 3 | 2 | 40.1 | 39.5 | 39.9 | 40.2 | 40.0 |
| 3 | 3 | 40.1 | 39.5 | 39.9 | 40.2 | 40.0 |
| 3 | 4 | 40.1 | 00.5 | 39.9 | 40.2 | 40.0 |

Mean = 37.99
S.D. = 8.82
Mean − S.D. = 29.16
Mean + S.D. = 46.81
The values rejected from the second mean are: 0.5
New Mean = 39.96
% Allowable above new mean, 10% or 43.95
% Allowable below new mean, 10% or 35.95
Readings of Board #2, Hole #4 with a reading of 0.5 pf rejected, as suspected OPEN

TABLE 2

| | | Test of Network #1 | | | | |
|---|---|---|---|---|---|---|
| NET # | Readings: HOLE # | BOARD #1 | BOARD #2 | BOARD #3 | BOARD #4 | BOARD #5 |
| 1 | 1 | 10.1* | 10.0 | 9.9 | 20.1 | 10.3 |
| 1 | 2 | 10.1 | 10.0 | 9.9 | 20.1 | 10.3 |
| 1 | 3 | 10.1 | 10.0 | 9.9 | 20.1 | 10.3 |

Mean = 12.08
S.D. = 4.15
Mean − S.D. = 7.92
Mean + S.D. = 16.23
The values rejected from the second mean are: 20.1, 20.1, 20.1
New Mean = 10.075
% Allowable above new mean, 10% or 11.08
% Allowable below new mean, 10% or 9.08
Readings of 20.1 rejected as suspected SHORTS
*Readings in picofarads.

The values associated with the faults are removed and the "norm" is calculated on the basis of the consistent data.

Once the "norm" values have been established the system is then set up to test interconnection boards of the same type. The test sequence concept is exemplified in FIG. 2c and the sequence for diagnosing the data is described in FIG. 2d.

Figure 2C:
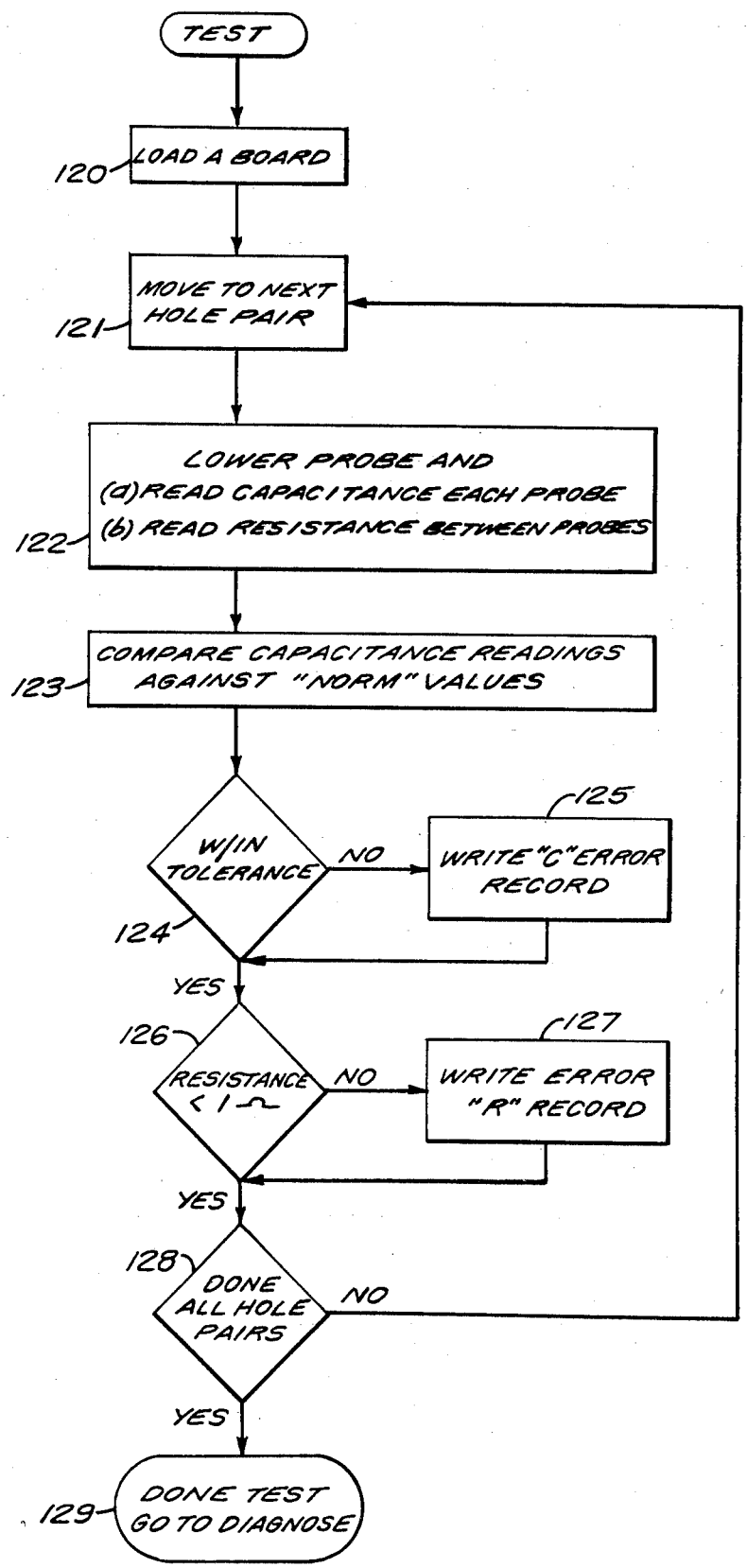
Figure 2D:
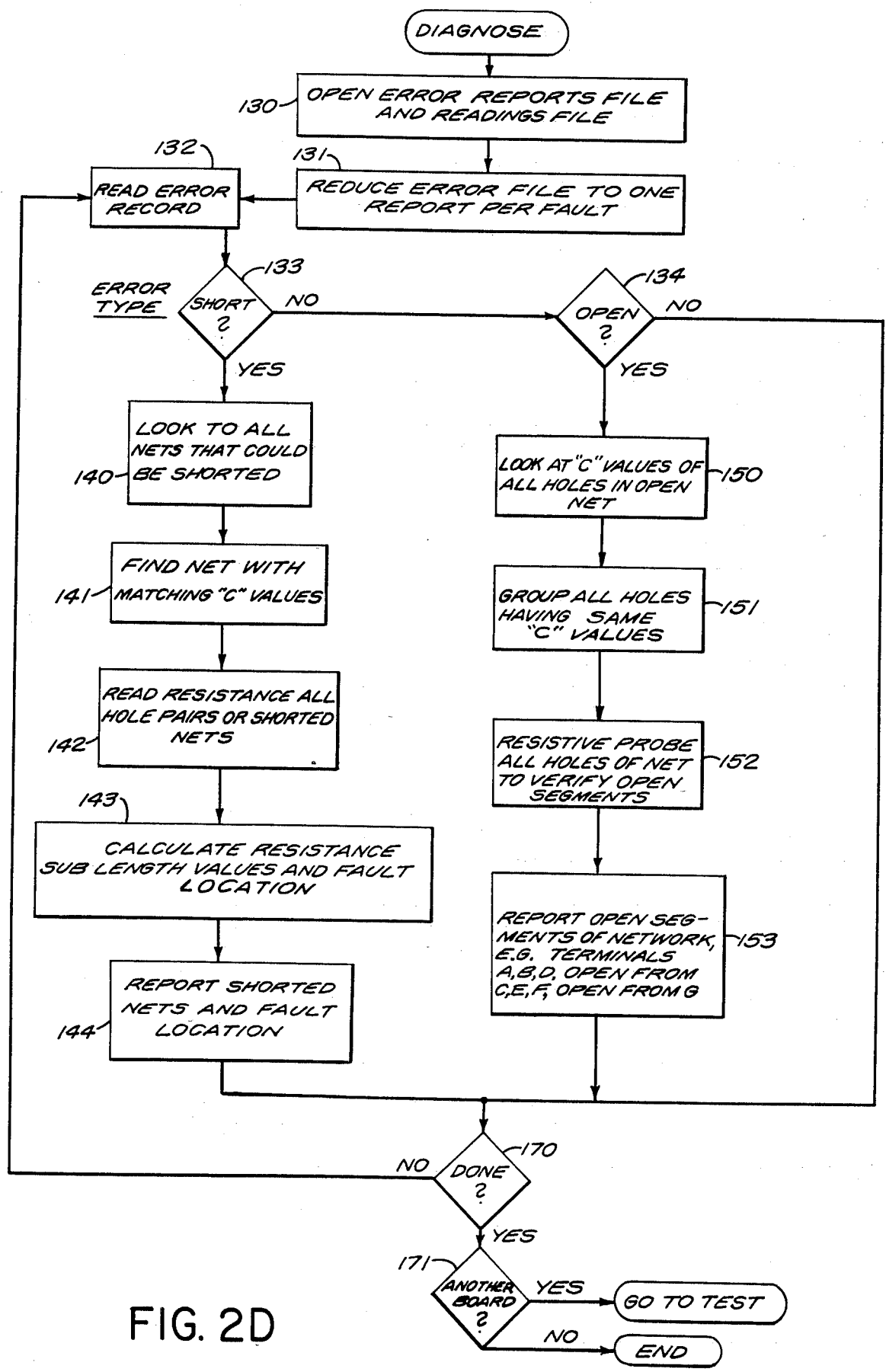

To test a board in the sequence called "TEST" in FIG. 2C, the first step, 120, is to load the board into the system i.e., to place the board upon dielectric layer 11 over conductive plate 12. The control computer then moves the probes to the locations for the first terminal hole pair in step 121 as described hereinbefore. Once the probes are in position over the terminal holes or lands, the probes are sequentially lowered and the capacitive measurement instrument 32 is activated to measure the capacitance between the selected probe and the conductive plate. The system then switches to the resistance mode, the second probe is lowered and resistive measurement instrument 30 is activated to measure the resistance between the probes. The capacitive measurements are then compared with the "norm" values for the respective terminal holes in step 123. If in decision 124 the computer determines that the readings are within tolerance it goes on to decision 126. If not, an error record is recorded in step 125 recording the out of tolerance "C" readings indicative of a probable fault.

In decision 126 the computer examines the resistance reading between the probes and determines whether or not the reading is less than a specified value, for example, less than 1 ohm. If the resistance reading is higher than the specified value, thus indicating a probable resistive fault, an error message is recorded for the terminal pair in step 127 indicating the "R" resistive value actually measured.

The computer then proceeds to decision 128 which determines if all hole pairs or land pairs have been measured. If not, the computer goes to step 121 and advances the probes to the next hole or land pair in step 121 and takes another set of readings. Eventually, when all hole or land pairs have been measured the system progresses through step 129 to the next step as per the flow diagram in FIG. 2d called "DIAGNOSE" which analyzes the data and prints out a record indicating faults. In one embodiment of the invention the location of the faults is also indicated.

In the first step, 130, of the DIAGNOSE routine, the computer calls up the error reports and recorded values. In the next step, 131, these reports are examined to reduce the error file to one report per fault. For example, a single "short circuit" fault normally results in abnormally high capacitive readings at all terminal holes of the particular network in which the "short" occurs. Thus, when the computer notes that all of the capacitive readings of a particular network are above normal, these error messages are reduced to a single fault report. Likewise, "open circuit" faults, if they occur at other than at the ends of a network, normally result in several abnormally low capacitive readings in a network. These multiple indications can also be reduced to a single fault record. Resistive faults, if other than at the ends of a network, are also likely to result in several high resistive readings in the network and, hence, this condition also can be reduced to a single fault record.

Once the error file has been reduced to single fault records the computer routine proceeds to analyze each of the faults. The first step is to call up the pertinent data for a particular fault in step 132. In decisions 133 and 134 the computer determines the type of fault indicated by the record. If the data corresponding to the fault includes abnormally high capacitive readings the conditions are then analyzed as a "short circuit" fault (decision 133). If the fault data includes abnormally low capacitive readings the data is analyzed as an "open" circuit fault and if the capacitive readings are within range the data is analyzed as a resistive fault (decision 134).

The "short circuit" faults normally occur between two networks. Therefore in analyzing a short circuit fault the computer first looks through the data file to locate other networks which could be involved (step 140). If the computer is supplied with information indicating where conductors cross in the circuit board pattern, this information could be utilized to determine possible candidates. Another possible approach is to determine where likely conductor crossings occur based on the terminal hole locations of the different networks. A third approach is to simply examine all other networks having "short circuit" fault indications since generally a "short circuit" fault will involve two networks.

Once a list of candidates has been prepared by the computer, the next step, 141, is to determine if there are matching abnormally high capacitive values recorded in two different networks. Normally, if there is a "short circuit" between two conductor networks, all terminal holes in both conductive networks will show the same abnormally high capacitive value, since this is the capacitive reading corresponding to the combined conductor length of the two conductive networks.

In many applications identification of the networks interconnected by a "short circuit" condition is adequate identification of the fault location since it would enable the operator to visually examine the particular networks on interconnection board and determine the exact location of the fault. In such cases, the DIAGNOSE routine would simply advance to step 144, and print out information indicating which networks appear to be interconnected by the "short" condition.

If more exacting fault location information is desired the DIAGNOSE routine can proceed through steps 142 and 143. First, in step 142, the computer positions the probes to take additional resistance readings including all terminal pairs within the shorted networks. These resistive readings provide sufficient data to determine the approximate distance of each terminal hole to the point of the short circuit as well as the resistance of the short circuit connection between the networks.

Figure 3:
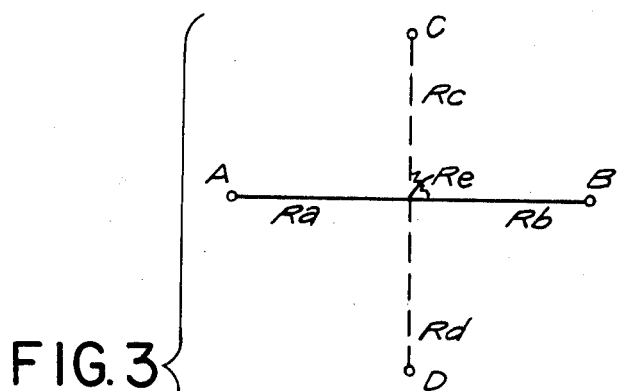
FIG. 3 is a diagram illustrating fault location using resistance measurements.

FIG. 3 is the simplified illustration showing how resistive measurements can be utilized to determine the distance from each terminal to the fault as well as the resistance of the short circuit connection between the networks. In FIG. 3 crossing networks AB and CD are shown shorted together at their crossing point by a resistive connection $R_e$. Resistance $R_a$ is the conductor resistance from the terminal hole A to the point of the short circuit fault whereas resistance $R_b$ represents the resistive value from terminal B to the point of the fault. Likewise, resistance $R_c$ is the conductor resistance from terminal C to the point of the fault and resistance $R_d$ is the conductor resistance from terminal D to the point of the fault.

If resistive measurements are made between each terminal pair of the two networks interconnected by the short, this results in six resistance readings RAB, RAC, RAD, RBC, RBD, RCD as indicated by the lines (a) through (f) in FIG. 3. These resistive measurements correspond to the sum of the resistive segments as indicated in FIG. 3. Inasmuch as there are six equations for five unknowns, the equations can be solved to derive the resistive values for each segment. From this information, since the resistance is approximately proportional to the conductor run length, it is possible to determine the approximate distance from each terminal to the point of the fault. If the resistive measurements are made in step 142 and analyzed in step 143, the information giving the approximate fault location in terms of distance from the respective terminals is printed out in step 144.

With shorted networks it may be desirable to make a further check to determine if an "open circuit" also exists. If all terminal points in the shorted networks show about the same abnormally high "C" values it can be assumed there are no "opens". However, if one or more values are lower than the rest, this indicates a probable "open" in addition to the "short" and is reported as such. The location of the "open" fault can be determined in a routine like that in steps 150–153 described hereinafter.

If the fault is of the "open circuit" type, the first step, 150, is to call up all of the capacitance readings for terminal points in the defective network. Terminal points in the network having similar values of capacitance are tentatively grouped together as belonging to either of the two or more separated "islands" of the broken network as shown in step 151. If the initial testing sequence does not include the resistance testing of each wire segment of the networks, this operation is performed on the defective network, as in step 152, to verify which segment(s) of the network are broken.

After the broken segments are verified, the clusters of connected holes or lands are reported in step 153.

Following steps 144 or 153, as the case may be, the computer determines, in decision 170, whether or not all faults in the error file have been analyzed. If not, the routine goes to step 132, calls up the next error record, and analyzes the data. When all error records have been analyzed the system advances to decision 171 and inquires if there is another board to be tested. If the answer is "yes" then the computer goes to the beginning of the "TEST" sub-routine (step 120 in FIG. 2C) and displays a cue to the operator indicating that a new board should be loaded. Otherwise, the computer provides a cue to the operator indicating that the test work is completed.

The operating mode according to the invention wherein the probes are programmed to make a capacitive measurement at each terminal point and a resistance measurement from each terminal point to a network end point provides a complete test of the board and a complete set of data for fault location. Another operating mode within the scope of this invention is to program the probes to make a resistive measurement from each terminal point to one of the associated network end points and to make at least one capacitive measurement for each network. With this arrangement the capacitive measurements can be used to detect short circuit conditions whereas the resistance measurements can detect open circuit conditions and resistance faults. The advantage of this operating mode is a further reduction in the number of required measurements without sacrificing completeness of the test. With this operating mode, however, data available for determining fault locations is less complete.

Still another operating mode within the scope of this invention is to measure capacitance at each terminal point and to measure resistance between the ends of each network. The capacitive measurements can detect the short circuit and open circuit faults whereas the resistance measurements can detect resistance faults in the conductor run. This arrangement would not necessarily detect resistance faults between terminal points and the conductor runs (unless at the network ends) but in many types of interconnection boards, particularily those made using graphics technology, faults of this type are most unlikely.

Common to the various operating modes according to this invention are the requirements (1) that at least one measurement be made from each terminal point (2) that at least one capacitive measurement be made for each network and (3) that the end to end resistance be measured for each network.

The invention has thus far been described in connection with testing a single layer board but, obviously, is equally as applicable to testing multi-layered boards which do not include interior ground planes or reference planes. The invention is also applicable to testing individual layers prior to lamination into multi-layered boards.

The invention is further applicable to interconnection boards including ground and reference planes. A example of such an interconnection board is illutrated in an exploded view in FIG. 4. The upper layer 200 is the outer component pad layer and includes conductive pad areas along the edges for intersystem connections and conductive pad areas on the interior regions for connections to components mounted on the board.

The next layer 210 includes a high density signal wiring layer. This interior layer can be produced chemically or by discrete wiring and includes the conductors for signal connections between components and edge terminal pads. The interconnection board may include one or more such interior layers containing the conductors for the signal connections.

The third layer 220 includes power and ground distribution conductors 222 and 224 which cover most of the surface of the layer. The non conductive areas in layer 220 are used to separate the power areas from the ground areas and to provide vacant land areas so that plated through hole connections between upper layers 200 and 210 will not connect to the ground and power conductors.

The bottom layer 230 acts as a support plane and can be made of a variety of known substrate materials which can be dielectric or metallic. In high quality boards, for example, layer 230 could be "TCE matched"(temperature coefficient of expansion matched) using a metal alloy such as 42% nickel–58% iron.

Figure 4:
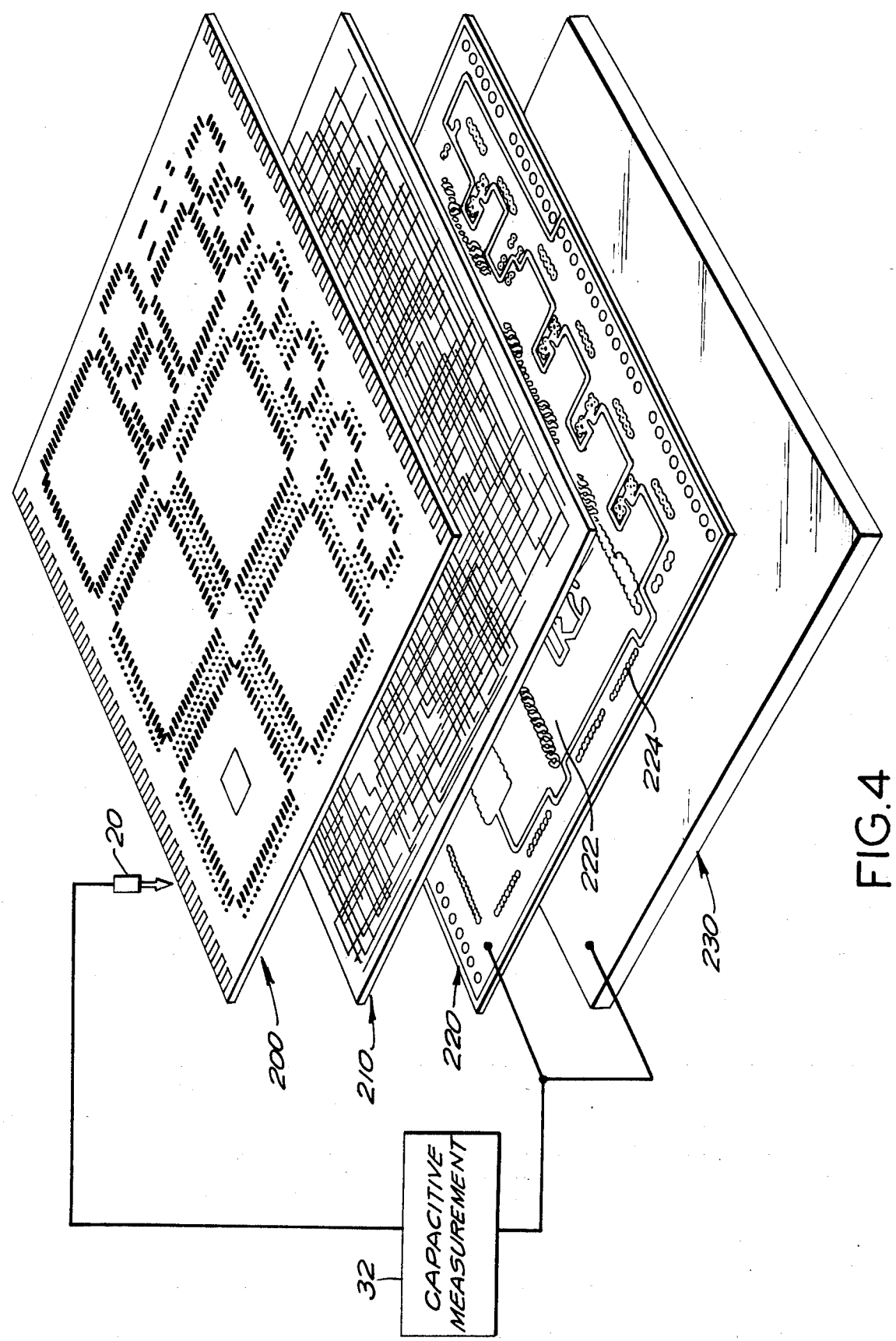
FIG. 4 is an exploded view showing an interconnection board with an internal reference plane connected for capacitive measurements.

With interconnection boards of the type illustrated in FIG. 4 it is not possible to make capacitive measurements between the signal conductors and an outside reference plane as illustrated in FIG. 1 because of conductive layers 220 and/or 230. For testing of such a board the power and ground distribution conductors and metallic substrate layer (if present) are all connected together to form the reference plane for the capacitive measurements. Thus, as shown in FIG. 4, one side of the capacitive measuring device 32 is connected to moving probe 20 whereas the other side of the measuring device is connected to power and ground conductors 222 and 224 of layer 220 as well as layer 230 if it is a metalic substrate. Although the connections shown in FIG. 4 are made directly to the power and ground distribution conductors, in a completed board the connections would more conveniently be made through the appropriate terminal points connected thereto from the upper layer.

While only a few illustrative embodiments have been described in detail it should be apparent to those skilled in the art that there are other variations within the scope of this invention which is more particularly defined in the appended claims.

We claim:

1. A method for testing rigid or flexible electrical interconnection network boards including at least two networks including terminal points and interconnecting conductors, said method comprising the steps of:
 establishing an electrically conductive reference means in a predetermined electrical and geometrical position with respect to the surface containing the interconnecting conductors of the networks, and separated therefrom by a dielectric;
 making measurements from terminal points of the interconnection board being tested including
  at least one impedance measurement from a terminal point of each network to said reference means, and
  at least a measurement of the end-to-end resistance of each network;
 with either the impedance or the resistance measurement(s) being made first;
 comparing said measured impedance and resistance values with the respective pre-established values for an interconnection board with no electrical faults; and indicating faults when either
  (a) said impedance measurement value is above said respective established value by more than a predetermined amount;
  (b) said impedance measurement value is below said respective established value by more than a predetermined amount; and/or
  (c) said resistance measurement value departs from said respective predetermined value.

2. The method of claim 1, wherein the conductive reference means is a conductive reference plane substantially parallel to the plane of the interconnecting conductors of said networks.

3. The method of claim 1 or 2 including testing each segment of each network for its resistance value and each network for its impedance value.

4. The method of claims 1 or 2 including measuring the capacitive value of each network from each of its terminal points and the resistance value between the end terminal points of said network.

5. The method of claim 1 or 2 including measuring the impedance value for each network from one terminal point, and the resistance value from each terminal point to the end point of said network.

6. The method according to claim 1 wherein said pre-established impedance values of a board free of defects are determined by a learning sequence wherein said established value is the means of measured values on a plurality of interconnection boards of the respective kind which are within one standard deviation of each other.

7. The method of claim 6 wherein said established values of impedance are obtained by:
 obtaining a data set of impedance values for a terminal point on a sample lot of interconnection boards; and
 calculating the mean value and standard deviation for the initial data set for the terminal point; and
 discarding the values lying outside the standard deviation range; and
 then calculating said pre-established value as equal to the mean value of the remaining measurements.

8. The method in accordance with claim 1 said impedance measurement is a capacitance measurement.

9. Apparatus for testing rigid or flexible electrical interconnection network boards including at least two networks and a plurality of terminal points interconnected by electrical conductors to form a predetermined pattern, comprising
 at least two independently movable probes for contacting selective terminal points of the said interconnection board being tested;
 positioning means associated with at least one of said probes for positioning the same to contact selected terminal points on the interconnection board;
 conductive reference means spaced from said conductor network of the interconnection board by a dielectric;
 impedance measuring means connected to at least one of said probes to measure impedance between the probe connected thereto and said reference means;
 resistance measuring means connected to said probes to measure electrical resistance between said probes; and
 control means for moving said probes and for activating said measuring means to obtain:
  (a) at least one impedance measurement from a terminal point of each network to said reference means; and (b) at least a measurement of the end-to-end resistance of each network.

10. The apparatus of claim 9 wherein said electrically conductive reference means is a conductive plane arranged substantially parallel to the plane of the interconnecting conductors of the networks of the said interconnection board.

11. The apparatus of claim 9 or 10 wherein said conductive reference means is a means separate from the interconnection board to be tested.

12. The apparatus of claim 9 or 10 wherein said conductive reference means is an interior conductive means located within the interconnection board being tested.

13. The apparatus in accordance with claim 10 wherein said control means for moving said probes and for activating said measuring means is operable to obtain at least one impedance measurement for each terminal point of the interconnection board being tested.

14. The apparatus in accordance with claim 10 wherein said control means for moving said measuring probes is operable to obtain at least one resistance measurement from each terminal point of the interconnection board being tested.

15. The apparatus in accordance with claim 10 wherein the impedance measuring means are capacitance measuring means.

16. A method of testing interconnection boards including at least two networks including terminal points and interconnecting conductors comprising the steps of:
establishing a conductive reference means in a predetermined electrical and geometrical position with respect to the surface containing the interconnecting conductors of the networks, and separated therefrom by a dielectric;
making at least one impedance measurement from a terminal point of each network and to said reference means for a plurality of interconnection boards in a sample lot;
determining the mean impedance value for each measured terminal point;
discarding measured impedance values which deviate from said average impedance values by more than a predetermined amount and determining the average impedance values for the remaining measurements to derive a respective reference value;
similarly measuring impedance values for other like interconnection boards and
rejecting as circuit faults any measurements higher than said reference value by more than a predetermined amount, and
rejecting as circuit faults any measurements lower than said respective reference value by more than a predetermined amount.

17. The method according to claim 16 wherein measured impedance values are discarded which deviate by more than one standard deviation from said mean values.

18. The method according to claims 16 or 17 wherein the said impedance value is a capacitance value and measured between each terminal point and said reference means.

19. The method according to claim 18 wherein at least one capacitive measurement is made from a terminal point of each network of the interconnection board being tested.

20. The method according to claim 16 wherein said conductive reference means is an internal conductive layer of the interconnection board being tested.

21. The method according to claim 16 wherein said conductive reference means is a conductive plane exterior to the interconnection board being tested.

22. A method for testing interconnection boards including terminal points and interconnecting conductor networks and for indicating locations of faults therein comprising the steps of:
establishing a conductive reference plane
parallel to the plane of the terminal points and interconnecting conductor networks, and
separated therefrom by a dielectric;
measuring the capacitance between a particular terminal point and said reference plane;
comparing said measured capacitance value with the known correct value for an interconnection board with no faults present;
indicating an open circuit fault if said measured capacitance value is less than said known correct value by a predetermined amount; and
determining the fault location for any such open circuit fault relative to said measuring point in accordance with the magnitude of deviation from said known correct value.

23. The method according to claim 22 wherein said known correct value is determined by
making similar measurements on a sample plurality of like interconnection boards,
determining the mean and standard deviation of said measurements,
discarding measured values more than one standard deviation from said mean and determining the average value of the remaining measurements as said known correct value.

24. The method according to claim 22 further including at least one capacitive measurement from a terminal point of each network of the interconnection board being tested.

25. The method according to claim 24 further including a capacitive measurement at each terminal point of the interconnection board being tested.

26. The method according to claim 22 wherein said conductive reference plane is an interior conductive layer of the interconnection board being tested.

27. The method according to claim 22 where said conductive reference plane is a conductive plate outside the interconnection board being tested.

28. A method for testing interconnection boards including terminal points and interconnecting conductor networks comprising the steps of:
establishing a conductive reference plane
parallel to the plane of the terminal points and interconnecting conductor networks and
separated therefrom by a dielectric;
measuring the capacitance between at least one terminal point of each network and said reference plane;
comparing said measured capacitance value with the known correct value for interconnection boards with no faults therein;
indicating as a short circuit fault for any measured capacitance which is higher than the respective known correct value by more than a predetermined amount; and
indicating as shorted together any networks showing similar high values.

29. The method according to claim 28 wherein said known correct value is determined by
making similar measurements on a sample plurality of like interconnection boards, determining the mean and standard deviation of said measurements, discarding measured values more than one standard deviation from said mean and determining the average value of the remaining measurements as said known correct value.

30. The method according to claim 28 further including at least one capacitive measurement from a terminal point of each network of the interconnection board being tested.

31. The method according to claim 30 further including a capacitive measurement at each terminal point of the interconnection board being tested.

32. The method according to claim 28 wherein said conductive reference plane is an interior conductive layer of the interconnection board being tested.

33. The method according to claim 28 where said conductive reference plane is a conductive plate outside the interconnection board being tested.

* * * * *